United States Patent
Bhowmik et al.

(10) Patent No.: US 6,699,372 B2
(45) Date of Patent: Mar. 2, 2004

(54) METHOD OF COIL PREPARATION FOR IONIZED METAL PLASMA PROCESS AND METHOD OF MANUFACTURING INTEGRATED CIRCUITS

(75) Inventors: Siddhartha Bhowmik, Allentown, PA (US); Sailesh M. Merchant, Orlando, FL (US); Frank Minardi, Kissimmee, FL (US)

(73) Assignee: Agere Systems Guardian Corporation, Miami Lakes, FL (US)

( * ) Notice: Subject to any disclaimer, the term of this patent is extended or adjusted under 35 U.S.C. 154(b) by 56 days.

(21) Appl. No.: 09/836,365

(22) Filed: Apr. 16, 2001

(65) Prior Publication Data

US 2002/0189932 A1 Dec. 19, 2002

(51) Int. Cl.[7] .............................................. C23C 14/34
(52) U.S. Cl. ........................ 204/192.16; 204/192.12; 204/192.15; 204/192.17
(58) Field of Search ................. 204/192.12, 192.18, 204/192.16, 192.17

(56) References Cited

U.S. PATENT DOCUMENTS

| | | | |
|---|---|---|---|
| 5,707,498 A | * | 1/1998 | Ngan ..................... 204/192.12 |
| 5,876,574 A | | 3/1999 | Hofmann et al. |
| 5,985,759 A | | 11/1999 | Kim et al. |
| 6,059,872 A | | 5/2000 | Ngan et al. |
| 6,071,811 A | | 6/2000 | Ngan |
| 6,110,821 A | | 8/2000 | Kohara et al. |
| 6,139,696 A | | 10/2000 | Arunachalam et al. |
| 6,140,228 A | | 10/2000 | Shan et al. |
| 6,176,978 B1 | * | 1/2001 | Ngan ..................... 204/192.12 |
| 6,277,253 B1 | * | 8/2001 | Narasimhan et al. .. 204/298.06 |

* cited by examiner

Primary Examiner—Rodney G. McDonald

(57) ABSTRACT

The present invention provides a method of depositing a film on a surface of a coil that includes depositing a metal from a target onto a surface of a coil to form a first film on the surface and forming a second film over the first film at a low pressure and at a first power at the target that is substantially higher than a first power at the component's surface. The conditioned deposition tool is well suited for manufacturing integrated circuits.

29 Claims, 4 Drawing Sheets

METHOD OF COIL PREPARATION FOR IONIZED METAL PLASMA PROCESS AND METHOD OF MANUFACTURING INTEGRATED CIRCUITS

TECHNICAL FIELD OF THE INVENTION

The present invention is directed, in general, to a method of coil preparation for an ionized metal plasma process.

BACKGROUND OF THE INVENTION

In the field of semiconductor device fabrication, the continuing trend toward smaller device feature sizes continues to challenge current process technologies. One such process that is currently employed to aid in achieving these small device dimensions is an ionized metal plasma (IMP) deposition process. Such IMP processes may be used to sputter deposit films of metal or metal-containing compounds and leads to better bottom and sidewall step coverage from the directionality afforded by the target/coil configuration in an IMP process for a variety of device structures. These advantages allow the use of relatively thinner films in forming the device features thereby saving on equipment and consumables and also significantly reducing the processing times for subsequent fabrication steps.

Current IMP processes typically employ deposition chambers that have a coil that aids in the ionization of atoms as they are sputtered from the target. Commonly the coil is composed of the same material as the target. For example, for depositing a titanium or titanium-containing film on a wafer, the titanium is used as the coil material. When another film composition is desired, the coil is composed of the corresponding metal.

During IMP deposition processes, the metal sputtered from the target builds up on the coil. It was discovered that this build-up of metal was a source of wafer contamination in that the built-up metal would often flake off of the coil and onto the wafer, thereby contaminating that particular level of the wafer. To reduce this contamination problem, the industry adopted a process of knurling the surface of the coil to increase adhesion of any metal deposited on the coil. Prior to use in conventional processing of semiconductor wafers, IMP coils are subjected to an extensive conditioning process, known as burn-in. During this conventional conditioning process, substantial quantities of material are deposited on the coil and on the walls of the deposition chamber. It had been thought that knurling of the coil surface provided sufficient adhesion between the deposited material and the coil surface.

However, this knurling process has proven unsatisfactory in the manufacture of semiconductor devices because it has been found that these conventional methods do not prevent delamination or flaking of the deposited metal to a satisfactory degree, even where a coil having a knurled surface is used. This delamination or flaking is thought to be caused by non-uniformities, such as voids, that form at the interface of the coil and the deposited metal, which are illustrated in FIGS. 1A and 1B. FIG. 1A is a cut away view of a section of the coil after deposition of a metal thereon. As seen in FIG. 1B, which is an enlarged view of FIG. 1A, voids have formed at the interface of the coil and the deposited metal. It is believed that these voids cause deposited metal to adhere poorly to the coil, which in turn, causes the deposited metal to flake off prematurely and thus shorten the useful life of the coil. For example, while the useful life of a coil is rated at approximately 400 kWh by the manufacturer, delamination may be observed after the chamber has been operated only about 150 kWh. Even when operated for less than 150 kWh coils may show bubbles or blisters, indicating that the delamination process has begun. It is thought that these blisters result from poor adhesion between the coil surface and the layers deposited during the conditioning process. The poor adhesion eventually leads to blister formation and their subsequent delamination. In severe cases, the delamination may cause a particle concentration that uses shorts or arcing in the fabricated devices, thereby reducing the wafer yield. When the wafer yield is so affected, the chamber must be taken off-line, cleaned, and the coil replaced. Lowered wafer yield and unit down time ultimately reduce revenue and increase product cost.

Accordingly, what is needed in the art is a process that improves adhesion and reduces delamination of the metal surface of the coil during operation.

SUMMARY OF THE INVENTION

To address the above-discussed deficiencies of the prior art, the present invention provides a method of depositing a film on a surface of a component of a deposition tool. In an advantageous embodiment, the method includes depositing a metal from a target onto a component's surface of a deposition tool to form a first film on the component's surface and forming a second film over the first film at a low pressure and at a first power at the target that is substantially higher than a first power at the component's surface. In an exemplary embodiment the deposition tool may be a coil. It should, of course, be understood that the above process can be used for a processes for manufacturing integrated circuits.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 2:
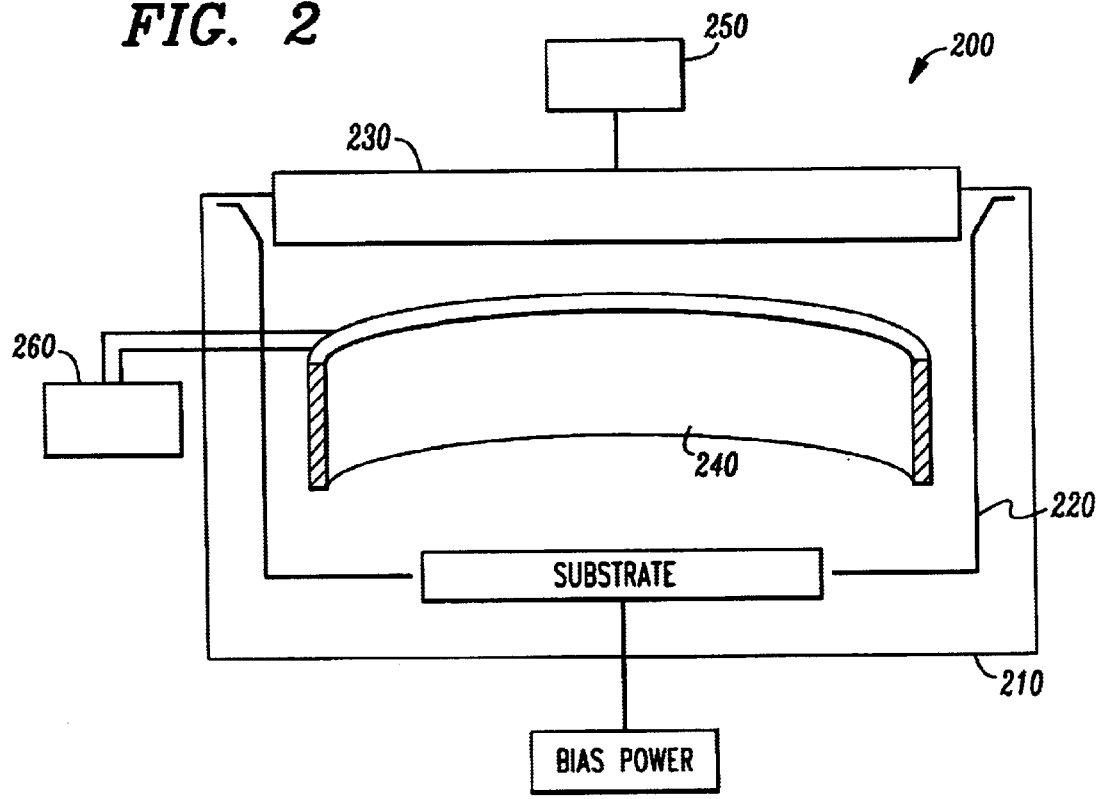
FIG. 2 illustrates schematic representation of a deposition chamber for ionized metal processes.

Referring initially to FIG. 2, there is illustrated a deposition tool 200 which may be used to practice the present invention. The deposition tool 200 is suitable for ionized metal plasma deposition process. To that end, the deposition chamber 100 may includes various components, such as a vacuum chamber 210, a shield 220, a target 230, or a coil 240. While specific reference is made with respect to the coil 240, it should be understood that the present invention may also be applicable to any of these components associated with the deposition tool 200.

In particular embodiments the target may comprise any material suitable for use as target 230 in a ionized metal plasma process. Particularly useful targets 230 may include a variety of materials such as aluminum, titanium, zirconium, vanadium, tantalum, molybdenum, or tungsten. However, the target material of the present invention is not limited to these materials since the method of the present invention may be applied to any material used as a target in ionized metal plasma deposition processes.

One skilled in the art will also readily realize that the deposition tool 200 is capable of being operated at reduced pressures and various gas inputs and outputs for establishing, maintaining and monitoring the desired ambients present at different stages of the deposition process. The deposition tool 200 may also include a power supply 250 to apply a power to the target 230 and an RF power supply 260 to supply a power to the coil 240.

Figure 3:
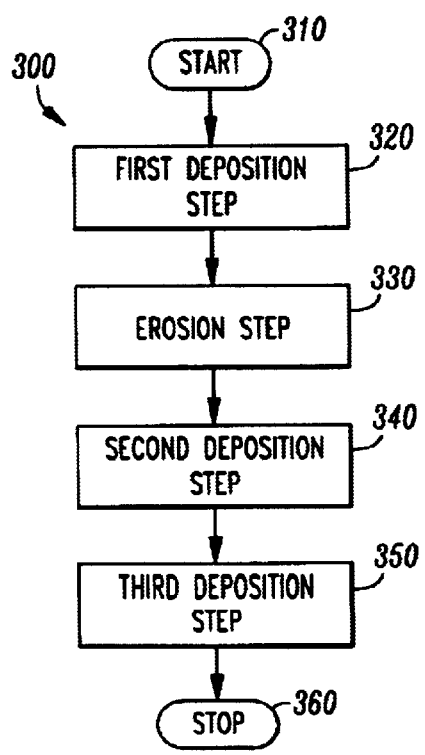
FIG. 3 illustrates a flowchart an embodiment of the present invention.

Now with Reference to FIG. 3 and continuing reference to FIG. 2, there is depicted a flow diagram of the method 300 that illustrates an embodiment of the present invention. Method 300 begins at Start Step 310 where the chamber of the deposition tool 200 is evacuated and readied for a conventional IMP process. Start Step 310 may be followed by First Deposition Step 320 wherein the a first film is deposited on the coil 240. In an advantageous embodiment, First Deposition Step 320 may be followed by Erosion Step 330 where at least a substantial portion of the first film deposited in First Deposition Step 320 may be removed. In a more specific embodiment, the first film may be entirely removed, if so desired.

Following the First Deposition Step 320 or Erosion step 330, depending on the embodiment, a Second Deposition Step 340 is conducted in which a second film is deposited over either the first film or eroded surface, again depending on the embodiment. In other advantageous embodiments, Second Deposition Step 340 may be followed by a Third Deposition Step 350 wherein a third film is formed over the second film deposited in Second Deposition Step 340. The film formed in Third Deposition Step 350 may comprise a single layer or a multilayer and may also comprise a metal, metal nitride, metal silicide, or metal silicide nitride. In an advantageous embodiment Third Deposition Step 350 produces an alternating metal/metal nitride multilayer. The process ends with Stop Step 360 after the final layer has been deposited. The specific requirements of each of these steps will be detailed below.

Figure 4:
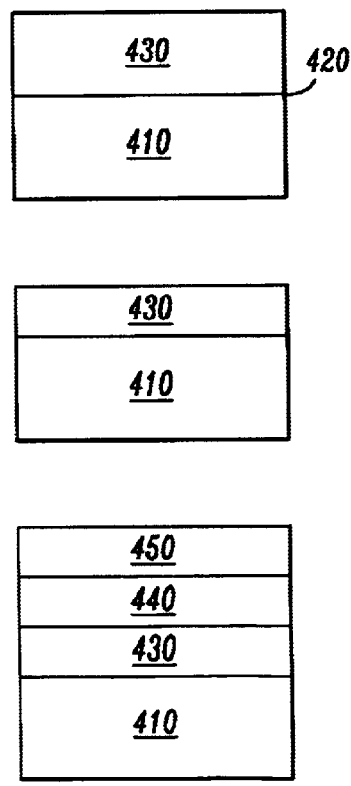
FIG. 4 illustrates a schematic representation of a deposition tool formed by a embodiment of the present invention.

Having discussed the general embodiments above, an example of a more specific advantageous embodiment will now be discussed. With continuing reference to FIGS. 2 and 3, FIG. 4 illustrates a schematic representation of the coil 400 formed according to the principles of the present invention. In a particular embodiment of the present invention, the First Deposition Step 320 may deposit a first film 430 on the surface 420 of a coil 240. In an exemplary process for the preparation of a coil having a first metal of titanium, the deposition tool 200 may contain an argon ambient. Where a titanium nitride layer is also desired, the deposition tool 200 may contain an ambient including argon and nitrogen. One skilled in the art will recognize that other inert ambients may be employed and are not outside the scope of the present invention. In this exemplary process, the ambient may be maintained at a flow rate of about 25 sccm to about 30 scam and the pressure within the deposition tool 200 may be about 10 to about 15 mTorr when the metal is being deposited. To form at least a portion of the first film 430 on the coil 240, an initially low power may be supplied from the power supply 250 to the target 230. This low power setting may be about 500 watts and may be applied for about 300 seconds. After about 300 seconds the power to power supply 150 may be turned off to allow the target 230 and coil 240 to cool for about 60 seconds.

In a subsequent burn step, the power supply 250 supplies a power of about 500 watts to the target while the RF power supply 260 applies a power from about 2000 to about 2500 watts to the coil. The power from RF power supply may be applied in a ramped manner. In a particular embodiment the RF power supply 260 is operated at a ramp of about 2000 watts/second to about 2500 watts/second. In this burn step the power to the power supply 250 and power supply 260 may be applied for about 180 seconds. Again, the power from the power supplies is turned off for about 60 seconds to allow the apparatus to cool. In certain embodiments, applying the power to the target 230 and coil 240 and subsequently cooling as discussed above may be repeated from 1–10 times. In an exemplary embodiment, the target and coil are both comprised of titanium. Thus, the first film may be a titanium film while the second film may be titanium, titanium nitride, or titanium silicide. It should be understood that the present invention is not limited to titanium inasmuch as other metals, such as aluminum, zirconium, vanadium, tantalum, molybdenum, tungsten and nitride and silicides, may also be used in a similar manner as just discussed for titanium.

In a particularly useful embodiment this process may be repeated 7–10 times. After repeating this process as desired, the process of depositing the first film 430 may be continued by increasing the power applied to the target 230 to about 1000 watts and ramped at 2500 watts/second while that of the coil 240 is maintained as in the previous step. This burn step may be allowed to proceed for about 60 to about 120 seconds followed by a cooling period as described above. This alternating burning and cooling process step may also be repeated 7–10 times. In particular embodiments, the power applied to the target 230 during the repeated burn steps may be incrementally increased from 1000 watts to about 8000 watts to deposit material from the target 230 onto the coil 240. One skilled in the art will understand that net deposition of portions of the first film 430 occurs where the power applied to the target 230 is greater than the power applied to the coil 240. The First Deposition Step 320 may be terminated by cooling for 60 seconds and subsequently applying a vacuum to the deposition tool 200.

Thus, First Deposition Step 320 forms a first film 430 that includes a metal of which the target 230 is comprised on the surface 420 of the coil 240. As discussed above, the first film 430 may comprise any material that may be suitable as a target 230 in an ionized metal plasma process. Particularly useful materials for this first film 430 include aluminum, titanium, zirconium, vanadium, tantalum, molybdenum, or tungsten. The particular steps of the First Deposition Step 320 of this exemplary embodiment of the present invention are detailed in Table 1.

TABLE 1

Exemplary Embodiment of First Deposition Step 320

| Step | Time | DC Power to Target (W)/Ramp (W/sec) | RF Power to Coil (W)/Ramp (W/sec) |
|---|---|---|---|
| 1  | 15  | 0/0            | 0/0       |
| 2  | 300 | 500/0          | 0/0       |
| 3  | 60  | 0/0            | 0/0       |
| 4  | 180 | 500/0          | 2000/2000 |
| 5  | 60  | 0/0            | 0/0       |
| 6  | 120 | 500/0          | 2500/2500 |
| 7  | 60  | 0/0            | 0/0       |
| 8  |     | Repeat Steps 5–6 |         |
| 9  | 120 | 1000/0         | 2500/2500 |
| 10 | 60  | 0/0            | 0/0       |
| 11 | 120 | 2000/2000      | 2500/2500 |
| 12 | 60  | 0/0            | 0/0       |
| 13 | 120 | 3000/2000      | 2500/2500 |
| 14 | 60  | 0/0            | 0/0       |
| 15 | 60  | 4000/2000      | 2500/2500 |
| 16 | 60  | 0/0            | 0/0       |
| 17 | 60  | 5000/2000      | 2500/2500 |
| 18 | 60  | 0/0            | 0/0       |
| 19 | 60  | 6000/2000      | 2500/2500 |
| 20 | 60  | 0/0            | 0/0       |
| 21 | 60  | 8000/2000      | 2500/2500 |
| 22 | 60  | 0/0            | 0/0       |
| 23 | 3   | 0/0            | 0/0       |

One skilled in the art will appreciate that the first film 430 as formed above may be a considered a single layer although it is deposited in discrete portions or a multi-layer comprising multiple deposited layers of the target 230 material.

In another aspect of the exemplary process discussed above, the First Deposition Step 320 above may be followed by an Erosion Step 330. In other embodiments, Erosion Step 330 may be omitted. However, when employed, Erosion Step 330 erodes at least a portion of the first metal film 430. In certain embodiments, the Erosion Step 330 erodes at least a substantial portion, if not all, of the first metal film 430. For the purposes of this invention, at least a substantial portion means about 20%. Importantly, Erosion Step 330 should not substantially alter the surface structure, knurling, of the coil 240. The Erosion Step 330 may be accomplished by a series of subsets as discussed below.

Erosion Step 330 may begin by purging the deposition tool 200 for about 15 seconds with an inert ambient to establish a pressure of about 20 to 30 mTorr. Argon is a particularly useful ambient for this process and may be supplied at a rate of about 55 to about 60 sccm. Such flow rates permit faster erosion without increasing power to the coil. Thus, the power to the coil is applied from the RF power supply 260 at about 2750 watts. In preferred embodiments, the RF power supply 260 connected to the deposition tool operates in a non-ramped mode. Additionally, a relatively low power may then be applied to the target 230 from the power supply 250. Advantageously, power supply 250 may be set at about 2250 watts in a non-ramping mode. These powers may be applied to the target 230 and coil 240 for about 180 seconds. Subsequently, the target 230 and coil 240 are allowed to cool for about 60 seconds. These erosion and cooling subsets may be repeated. In certain embodiments the erosion and cooling are repeated about 1 to about 20 times. In more particular embodiments the erosion and cooling may repeated about 10 to 15 times. After the final cooling step, the deposition tool may be subjected to a dynamic vacuum for about 3 seconds. Practiced in this manner, Erosion Step 330 may remove a substantial portion of the first metal film 430. The particular steps of the Erosion Step 330 of an embodiment of the present invention are detailed in Table 2.

TABLE 2

Exemplary Embodiment of Erosion Step 330

| Step | Time (sec) | DC Power to Target (W)/Ramp (W/sec) | RF Power to Coil (W)/Ramp (W/sec) |
|---|---|---|---|
| 1 | 15  | 0/0    | 0/0    |
| 2 | 180 | 2250/0 | 2750/0 |
| 3 | 60  | 0/0    | 0/0    |
| 4 |     | Repeat steps 2–3 |  |
| 5 | 3   | 0/0    | 0/0    |

Either the Erosion Step 330 just described or the First Deposition Step 320, depending on the embodiment, may be followed by a Second Deposition Step 340 wherein the net effect is to form a second film 440 containing target 230 material over either the surface exposed by Erosion Step 330 or the first film. Again, the second film 430 may be formed by a series of substeps. In a particularly useful embodiment, after the deposition tool 200 is purged with argon and a pressure of about 5 to about 15 mTorr is maintained with a gas-flow rate of about 15 to about 20 sccm, the power supply 250 applies a power of 7000 watts to the target 230. In an advantageous embodiment, the flow rate may be about 16 sccm and the pressure may be about 8 or about 9 mTorr. In this step the power supply 250 may be operated in a ramped mode at 7000 watts/sec. Substantially lower power without ramping may be applied to the coil 240. In the exemplary embodiment the RF power supply 260 supplies no power to the coil 240. This step continues for about 120 seconds and is followed by a cooling step that lasts for about 30 seconds. One skilled in the art will realize that the net effect of these steps just described will be to form a second film 440 over either the first film 430 or the exposed surface of the first film 430 where the Erosion Step 330 is conducted. In exemplary embodiments, the deposition and cooling as described above may be repeated 20–30 times. Again, the Second Deposition Step 340 is completed by exposing the deposition tool 200 to a dynamic vacuum for about 3 seconds. While the second metal film 440 may be formed in discrete portions, one skilled in the art will understand that it may be considered a single layer. Thus, due to the reduced coil power of this exemplary process step, thermal stressing of the coil and deposited layers is reduced. The reduction in thermal stressing reduces or substantially eliminates porosity of the deposited layers and concomitantly reduces premature delamination of the coil. A particular embodiment of this portion of the method of the present invention is detailed in Table 3.

TABLE 3

Exemplary Embodiment of Second Deposition Step 340

| Step | Time (sec) | DC Power to Target (W)/Ramp (W/sec) | RF Power to Coil (W)/Ramp (W/sec) |
|---|---|---|---|
| 1 | 15  | 0/0       | 0/0 |
| 2 | 120 | 7000/7000 | 0/0 |
| 3 | 30  | 0/0       | 0/0 |
| 4 |     | Repeat steps 2–3 |  |
| 5 | 30  | 0/0       | 0/0 |

In a further aspect, various method embodiments the present invention may include a Third Deposition Step 350 for forming a third film 450 over the second film 440. The third film 450 may be a single layer or a multilayer and may comprise a metal or a metal nitride layer. Particularly useful materials comprising the third film 450 are metals and metal nitrides. Desirable metals include, but are not limited to, aluminum, titanium, zirconium, vanadium, tantalum, molybdenum or tungsten. Useful metal nitrides include, but are not limited to, aluminum nitride, titanium nitride, zirconium nitride, vanadium nitride, tantalum nitride, molybdenum nitride or tungsten nitride. In other embodiments the third film 450 may be a metal silicide or a metal silicide nitride. Exemplary metal silicides and metal silicide nitrides include titanium silicide, zirconium silicide, vanadium silicide, tantalum silicide, molybdenum silicide or tungsten silicide, and the metal silicide nitride is titanium silicide nitride, zirconium silicide nitride, vanadium silicide nitride, tantalum silicide nitride, molybdenum silicide nitride or tungsten silicide nitride. However, one skilled in the art will realize that the process for forming the third film 450 is not limited to these materials.

The third film 450 may be formed in an inert atmosphere at a by applying a power of 8000 watts ramped at 2000 watts/second to the target 230 and a substantially lower power to the coil 240 without ramping. In a particular embodiment no power is applied to the coil 240. In advantageous embodiments, forming metal portions of the third film 450 may be performed for about 60 seconds. However, one skilled in the art will realize that the amount of material deposited is a function of the powers applied to the target 230 and coil 240 as well as the duration of the process and that these parameters may be optimized without undue experimentation.

Where an exemplary titanium film is desired is the formation of third film 450, argon may be used as the ambient and may be supplied at a rate of 55 sccm to about 60 sccm during the process. In an advantageous embodiment the argon flow rate may be about 58 sccm. Where an exemplary titanium nitride layer is desired in the formation of third film 450, the ambient of the deposition tool 200 is adjusted to maintain an argon flow rate of about 20 scam to about 30 scam and a nitrogen flow rate of about 40 sccm to 50 sccm. An advantageous process may deposit titanium nitride at an argon flow rate of about 25 scam and a nitrogen flow rate of about 45 sccm. In an alternative embodiment the nitrogen flow rate may be reduced to about 25 sccm to about 30 sccm. However, one skilled in the art will realize that such a condition may increase the process time due to the lower concentration of nitrogen that is available for the formation of the nitride layer.

Whether deposition of a titanium, a titanium nitride layer, or a multilayer containing alternating layers of titanium and titanium nitride is desired, power supply 250 may apply a power of about 4000 watts without ramping to the target while the RF Power supply 260 applies a power of about 1000 watts ramped at 2500 watts/second to the coil 240 for about 4 seconds. After about 4 seconds the power applied to the coil 240 is reduced for about 80 seconds while the power is maintained at the target 230. In particular embodiments, no power is applied to the coil 240 during this time.

Interleaving the metal deposition steps of Third Deposition Step 350 a gas stabilization procedure may be performed. In this procedure the appropriate ambient, as discussed above, may be established by exposing the deposition tool 200 to the desired ambient for about 15 seconds before continuing with the next deposition step. Third Deposition Step 350 ends by the application of a dynamic vacuum to the deposition tool 200.

In the exemplary embodiment, the Third Deposition Step 350 is carried out to form a multilayer comprising alternating layers of target metal and metal nitride. In a particular embodiment a multilayer having about 4 titanium layers and about 4 titanium nitride layers may be formed. Table 4 indicates an exemplary embodiment of this step of the present invention.

TABLE 4

Exemplary Embodiment of Third Deposition Step 350

| Step | Time (sec) | DC Power to Target (W)/Ramp (W/sec) | RF Power to Coil (W)/Ramp (W/sec) | Ar Flow (SCC) | N₂ Flow (SCC) |
|---|---|---|---|---|---|
| 1 | 3 | 0/0 | 0/0 | — | — |
| 2 | 15 | 0/0 | 0/0 | 58 | 0 |
| 3 | 60 | 0/0 | 0/0 | 58 | 0 |
| 4 | 15 | 0/0 | 0/0 | 25 | 45 |
| 5 | 4 | 4000/1000 | 2500/2500 | 25 | 45 |
| 6 | 79 | 4000/0 | 2500/0 | 25 | 28 |
| 7 | Repeat Steps 2–6 | | | | |
| 8 | 15 | 0/0 | 0/0 | — | — |

Figure 6:
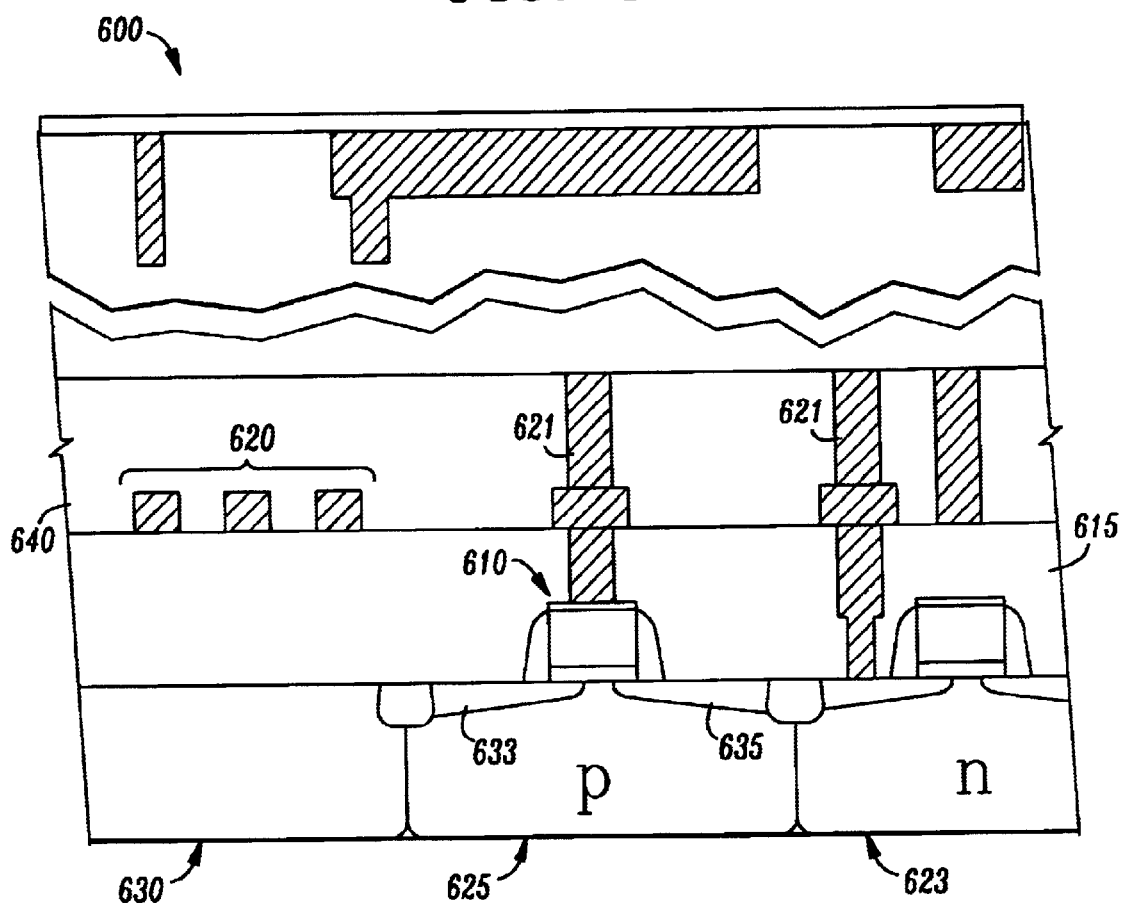
FIG. 6 illustrates a schematic representation of an integrated circuit fabricated according to the principles of the present invention.

Turning briefly to FIG. 6, there is illustrated a cross-sectional view of a conventional integrated circuit 600, that might be manufactured according to the principles of the present invention. The integrated circuit 600 may include devices, such as CMOS devices, BiCMOS devices, Bipolar devices, EEPROM devices, including Flash EPROMS, optical or optoelectronic devices, passive devices, such as resistors, inductors, or capacitors, or other type of similar devices. Also shown in FIG. 6 are components of the conventional integrated circuit 600, including: transistors 610, a first dielectric layer 615, the metal feature 620 and the fluorinated dielectric layer 640. The metal feature 620 along with interconnect structures 621 form part of an interconnect system that electrically connects the transistors 610 to form an integrated circuit 600. Moreover, one having skill in the art knows how to electrically connect the metal feature 620 to complete the integrated circuit 600. Also illustrated, are conventionally formed tubs, 623, 625, source regions 633 and drain regions 635, all located over a substrate 630.

Figure 1A:
FIG. 1A illustrates a coil-metal interface of an IMP coil prepared by conventional methods.
Figure 1B:
FIG. 1B illustrates an enlarged view of FIG. 1A.
Figure 5A:
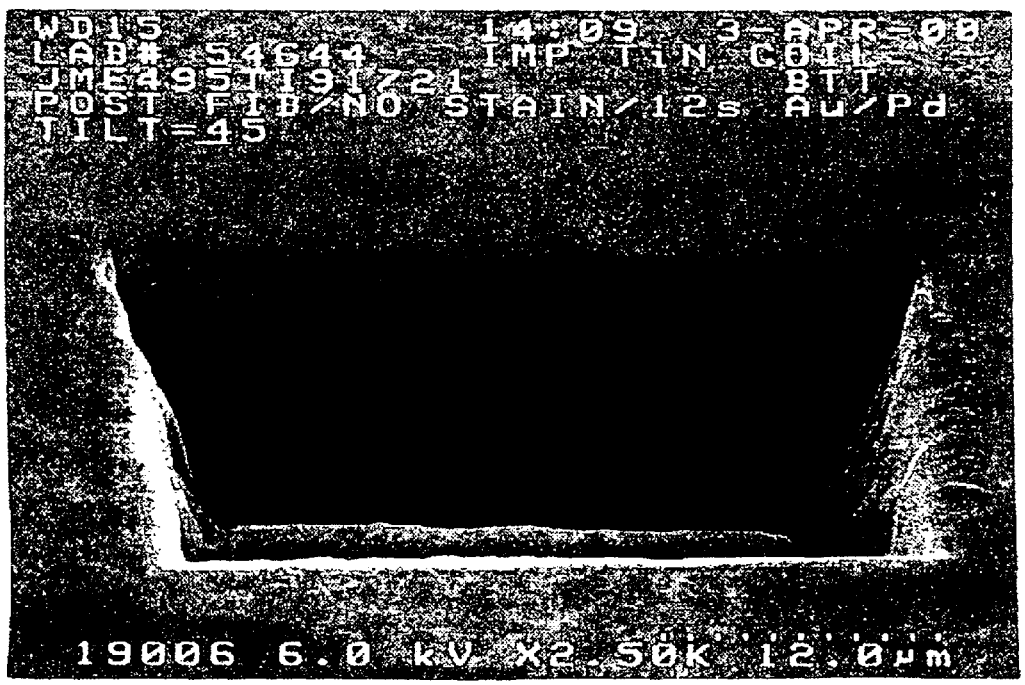
FIG. 5A illustrates a cut away view of a deposition tool-metal interface of an IMP coil prepared by an embodiment of the present invention.
Figure 5B:
FIG. 5B illustrates an enlarged view of FIG. 5A showing the uniform interface between the coil and the deposited metal.

The present invention as discussed in detail above substantially reduces delamination and thereby lengthens the useful life of the coil 400, which is in contrast to conventional techniques. As depicted in FIG. 1, conventional processes produce coils where the interface between the original coil surface and the initial layers of deposited target material is very porous. Surprisingly, the present invention is capable of producing a coil having a substantially more uniform interface. FIG. 5 shows a microscopic view of the interface of the coil obtained according to the present invention. Compared to FIG. 1, the porosity of the interface is substantially reduced or eliminated. It is thought that the deposition of target material at a relatively lower chamber pressure and substantially reduced RF power supply setting produces this uniform interface between the surface of the tool and the deposited layers. In those embodiments that include the erosion step, it is believed that these results can be further enhanced. In turn, the uniform interface allows the subsequently deposited material to adhere well to the coil. Hence, the proper preparation of the surface by erosion and formation of the uniform interface may be highly important in substantially reducing or eliminating delamination of the coil. It will be apparent to those skilled in the art that the conditions recited in Tables 1–4 are included for illustrative purposes only and a range of conditions may be applied in the various steps where delamination of the coil may be substantially reduced.

Although the present invention has been described in detail, those skilled in the art should understand that they can make various changes, substitutions and alterations herein without departing from the spirit and scope of the invention in its broadest form.

What is claimed is:

1. A method of depositing a film on a surface of a component of a deposition tool, comprising:
   depositing a metal from a target onto a component's surface of a deposition tool to form a first film on the component's surface using a first manufacturing parameter;
   eroding at least a portion of the first film to form an eroded surface; then
   forming a second film from the metal from the target over the first film using a second manufacturing parameter that is different from the first manufacturing parameter.

2. The method as recited in claim 1 wherein eroding includes eroding at a second power at the component's surface that is greater than a second power at the target.

3. The method as recited in claim 1 wherein forming a second film include forming a second film at a low pressure less than about 15 millitorr.

4. The method as recited in claim 1 wherein forming a second film includes forming a second film at a first power at the target that is at least about 50% greater than a first power at the component's surface.

5. The method as recited in claim 4 wherein the first power at the target is about 7000 watts and the first power at the component's surface is about zero watts.

6. The method as recited in claim 5 wherein eroding includes eroding with a power of about 2,250 watts at the target and with a power of about 2,750 watts at the component's surface.

7. The method as recited in claim 1 further including creating a third metal film over the second metal film with the metal.

8. The method as recited in claim 7 wherein creating a third metal film includes creating a stacked layer comprising alternating layers of the metal, a nitride metal, a metal silicide, or a metal silicide nitride.

9. The method as recited in claim 1 wherein the metal is titanium, zirconium, vanadium, tantalum, molybdenum, tungsten or nitrides, silicides or nitride silicides thereof.

10. A method of depositing a film on a coil of a deposition tool, comprising:
    depositing a metal from a target onto a coil to form a first film that contains the metal on the coil, said depositing including using a first manufacturing parameter; and
    forming a second film containing the metal from the target over the first film using a second manufacturing parameter that is different from the first manufacturing parameter.

11. The method as recited in claim 10 further including eroding at least a substantial portion of the first film to form an eroded film wherein a second power at the coil is greater than a second power at the target prior to forming the second film.

12. The method as recited in claim 11 wherein eroding includes eroding with a second power of about 2,250 watts at the target and with a second power of about 2,750 watts at the coil.

13. The method as recited in claim 10 wherein forming a second film include forming a second film at a low pressure less than about 15 millitorr.

14. The method as recited in claim 10 wherein forming a second film includes forming a second film at a first power at the target that at least about 50% greater than a first power at the coil.

15. The method as recited in claim 14 wherein the first power at the target is about 7000 watts and the first power at the coil is about zero watts.

16. The method as recited in claim 10 further including creating a third metal film over the second metal film comprising the metal.

17. The method as recited in claim 16 wherein creating a third metal film includes creating a stacked layer comprising alternating layers of the metal and a metal nitride, metal suicide, or metal suicide nitride wherein the metal is aluminum, titanium, zirconium, vanadium, tantalum, molybdenum or tungsten, the nitride metal is aluminum nitride, titanium nitride, zirconium nitride, vanadium nitride, tantalum nitride, molybdenum nitride or tungsten nitride, the metal silicide is titanium silicide, zirconium silicide, vanadium silicide, tantalum suicide, molybdenum silicide or tungsten silicide, and the metal suicide nitride is titanium silicide nitride, zirconium silicide nitride, vanadium silicide nitride, tantalum silicide nitride, molybdenum silicide nitride or tungsten silicide nitride.

18. The method as recited in claim 10 wherein the metal is titanium, zirconium, vanadium, tantalum, molybdenum, tungsten or nitrides, silicides or nitride suicides thereof.

19. The method as recited in claim 10 further including depositing and forming alternating layers of the first and second films, respectively.

20. A method of manufacturing an integrated circuit comprising:
    forming a metal-containing film on a coil, including:
        depositing a metal from a target onto a coil to form a first film on the coil using a first manufacturing parameter; and
        forming a second film from the metal from the target over the first film using a second manufacturing parameter that is different from the first manufacturing parameter; and
        depositing metal over devices located on a semiconductor wafer; and
    interconnecting the devices to form an operative integrated circuit.

21. The method as recited in claim 20 further including eroding at least a substantial portion of the first film to form an eroded film wherein a second power at the coil is greater than a second power at the target.

22. The method as recited in claim 21 wherein eroding includes eroding with a second power of about 2,250 watts at the target and with a second power of about 2,750 watts at the coil.

23. The method as recited in claim 20 wherein forming a second film include forming a second film at a low pressure less than about 15 millitorr.

24. The method as recited in claim 20 wherein forming a second film includes forming a second film at a first power at the target that is at least about 50% greater than a first power at coil.

25. The method as recited in claim 24 wherein the first power at the target is about 7000 watts and the first power at the coil is about zero watts.

26. The method as recited in claim 20 wherein forming a metal-containing film on a surface of a coil further includes creating a third film over the second film.

27. The method as recited in claim 26 wherein creating a third film includes creating a stacked layer comprising alternating layers of the metal and a metal nitride, metal suicide, or metal silicide nitride wherein the metal is aluminum, titanium, zirconium, vanadium, tantalum, molybdenum or tungsten, the nitride metal is aluminum nitride, titanium nitride, zirconium nitride, vanadium nitride, tantalum nitride, molybdenum nitride or tungsten nitride, the metal silicide is titanium silicide, zirconium silicide, vanadium silicide, tantalum silicide, molybdenum silicide or tungsten suicide, and the metal silicide nitride is titanium silicide nitride, zirconium silicide nitride, vanadium silicide nitride, tantalum silicide nitride, molybdenum silicide nitride or tungsten silicide nitride.

28. The method as recited in claim 20 wherein the metal is titanium, zirconium, vanadium, tantalum, molybdenum, tungsten, or nitrides, silicides or nitride suicides thereof.

29. The method as recited in claim 20 wherein forming the metal-containing film includes depositing and forming alternating layers of the first film and the second film, respectively.

* * * * *